United States Patent
Noda et al.

(10) Patent No.: US 7,488,966 B2
(45) Date of Patent: Feb. 10, 2009

(54) RADIATION DETECTOR AND METHOD FOR PRODUCING PHOTOCONDUCTIVE LAYER FOR RECORDING THEREOF

(75) Inventors: Kazuhiro Noda, Ashigarakami-gun (JP); Takashi Matsui, Minamiashigara (JP); Yoshiko Hara, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/054,021

(22) Filed: Mar. 24, 2008

(65) Prior Publication Data

US 2008/0230710 A1 Sep. 25, 2008

(30) Foreign Application Priority Data

Mar. 23, 2007 (JP) ............................. 2007-075863
Nov. 12, 2007 (JP) ............................. 2007-292743

(51) Int. Cl.
*G01N 23/04* (2006.01)
(52) U.S. Cl. ..................................................... 250/580
(58) Field of Classification Search ................. 250/580
See application file for complete search history.

(56) References Cited

U.S. PATENT DOCUMENTS

| 5,598,004 | A | * | 1/1997 | Powell et al. | ........... 250/370.09 |
|---|---|---|---|---|---|
| 5,880,472 | A | * | 3/1999 | Polischuk et al. | ...... 250/370.09 |
| 2003/0168660 | A1 | * | 9/2003 | Terakawa et al. | ............. 257/52 |
| 2003/0223534 | A1 | * | 12/2003 | Sato et al. | ...................... 378/19 |

FOREIGN PATENT DOCUMENTS

| JP | 5819471 A | 2/1983 |
|---|---|---|
| JP | 2001244492 A | 9/2001 |

OTHER PUBLICATIONS

Fukunaga-T, Kajikawa-S. "Short range structure of amorphous Se/sub 100-x/As/sub x/ prepared by mechanical alloying," Journal of Non-Crystalline Solids, Aug. 1999, vol. 250-252, p. 384-8, 6 refs, ISSN: 0022-3093.*

* cited by examiner

*Primary Examiner*—David P Porta
*Assistant Examiner*—Jessica L Eley
(74) *Attorney, Agent, or Firm*—Sughrue Mion, PLLC (57) ABSTRACT

In a radiation detector, electrodes are provided on both sides of a photoconductive layer for recording. When the photoconductive layer for recording is irradiated with radiation during application of a predetermined bias voltage between the electrodes, electric charges are generated within the photoconductive layer for recording. Then, the generated electric charges are detected as an electric signal by the radiation detector. As the material for the photoconductive layer for recording, amorphous selenium having a coordination number of 1.95±0.02 is used.

6 Claims, 7 Drawing Sheets

RADIATION DETECTOR AND METHOD FOR PRODUCING PHOTOCONDUCTIVE LAYER FOR RECORDING THEREOF

BACKGROUND OF THE INVENTION

1. Field of the Invention

The present invention relates to a radiation detector that is appropriate for a radiographic apparatus using X rays or the like and a method for producing a photoconductive layer for recording of the radiation detector.

2. Description of the Related Art

Various kinds of radiographic apparatuses using X rays have been proposed and utilized in the field of radiography for medical diagnosis using X rays (radiation). In the radiographic apparatus, a radiation detector (including a semiconductor as a main element) is used as an X-ray image information recording means, and image signals representing an X-ray image related to a subject are obtained by detecting X rays that have passed through the subject by the radiation detector.

Further, various types of radiation detectors are proposed as the radiation detector that is used in the radiographic apparatus. For example, if the radiation detectors are classified based on charge generation processes, in which X rays are converted into charges (electric charges), there are a photo-conversion-type (indirect-conversion-type) detector, a direct-conversion-type detector and the like. In the photo-conversion-type detector, fluorescence emitted from a phosphor by irradiation with X rays is detected in a photoconductive layer and signal charges are obtained. Then, the signal charges are temporarily stored in a charge storage portion. Further, the stored charges are converted into image signals (electric signals), and the image signals are output. In contrast, in the direct-conversion-type detector, signal charges generated in a photoconductive layer by irradiation with X rays are collected at charge collection electrodes and temporarily stored in a charge storage portion. Then, the stored charges are converted into electric signals, and the electric signals are output.

Alternatively, if the radiation detectors are classified based on charge readout processes for reading out charges stored in the radiation detectors to the outsides of the radiation detectors, there are a light-readout-type detector, a TFT-readout-type detector and the like. In the light-readout-type detector, the charges are read out by irradiating the detector with read-out light (electromagnetic wave for readout). In contrast, in the TFT-readout-type detector, the charges are read out by scan-driving a TFT (thin film transistor) connected to the charge storage portion.

In the aforementioned radiation detector, charges corresponding to X-ray energy are generated by irradiating a charge generation layer of the radiation detector with X rays, and the generated charges are read out as electric signals. In the radiation detector, the photoconductive layer functions as a charge generation layer. Conventionally, as the material for the photoconductive layer, amorphous selenium (a-Se), PbO, $PbI_2$, $HgI_2$, $BiI_3$, Cd(Zn)Te and the like have been used.

If the amorphous selenium is used as the material, it is possible to easily increase the size (area) of the photoconductive layer by utilizing a thin-coating formation technique (thin-film formation technique), such as a vacuum vapor-deposition method (vacuum evaporation method). However, a photoconductive layer made of the amorphous selenium tends to include many structural defects because of the characteristic of the amorphous selenium as an amorphous material. Hence, if the amorphous selenium is used, the sensitivity of the layer tends to drop. Therefore, an appropriate amount of impurity is generally added (doping) to improve the performance of the photoconductive layer. For example, in U. S. Patent Application Publication No. 20030223534, amorphous selenium doped with alkali metal at 0.01 to 10 ppm is used as the material for the photoconductive layer for recording. Further, in Japanese Unexamined Patent Publication No. 2001-244492, amorphous selenium doped with Na, as an alkali metal, at 70 ppm is used as the material for the photoconductive layer for recording.

Further, a general method for depositing selenium by evaporation is disclosed in Japanese Unexamined Patent Publication No. 58 (1983)-019471.

Conventionally, it has been considered that amorphous selenium has sufficient hole-transportability (positive-hole-transportability or hole-mobility) because it is a P-type semiconductor and that electron-transportability (electron-mobility) of the amorphous selenium needs to be improved to obtain a radiation detector having a high sensitivity. In U. S. Patent Application Publication No. 20030223534 and Japanese Unexamined Patent Publication No. 2001-244492, the electron-transportability of amorphous selenium was improved by doping the amorphous selenium with sodium. The electron-transportability was improved by an effect of doping that electron trap centers included in charge defects of the amorphous selenium can be reduced.

However, to further improve the sensitivity of the layer, it is necessary to improve not only the electron-transportability but the hole-transportability so that generated carriers are transported to both electrodes. The inventors of the present invention have conducted intensive studies and found out that it is possible to greatly improve the hole-transportability while maintaining the high electron-transportability by setting the coordination number of amorphous selenium at a certain value.

SUMMARY OF THE INVENTION

In view of the foregoing circumstances, it is an object of the present invention to provide a radiation detector in which hole-transportability can be greatly improved while high electron-transportability is maintained. Further, it is another object of the present invention to provide a method for producing a photoconductive layer for recording of the radiation detector.

A radiation detector of the present invention is a radiation detector, wherein electrodes are provided on both sides of a photoconductive layer for recording, and wherein an electric charge generated within the photoconductive layer for recording by irradiation with radiation during application of a predetermined bias voltage between the electrodes is detected as an electric signal, and wherein the photoconductive layer for recording is made of amorphous selenium having a coordination number of 1.95±0.02.

The amorphous selenium having a coordination number of 1.95±0.02 refers to amorphous selenium in which the number of selenium atoms coordinating to selenium is 1.95±0.02.

Further, if the radiation detector is a radiation detector comprising:

a first conductive layer that transmits radiation for recording;

the photoconductive layer for recording, which exhibits photoconductivity by irradiation with the radiation for recording;

a photoconductive layer for readout that exhibits photoconductivity by irradiation with an electromagnetic wave for readout; and a second conductive layer that transmits the electromagnetic wave for readout, wherein these layers are superposed one on another in this order, and wherein radiation image information is recorded as an electrostatic latent image, the photoconductive layer for readout may optionally be made of amorphous selenium having a coordination number of 1.95±0.02.

Further, a method for producing a photoconductive layer for recording of the present invention is a method for producing a photoconductive layer for recording of a radiation detector, wherein in the radiation detector, electrodes are provided on both sides of the photoconductive layer for recording and an electric charge generated within the photoconductive layer for recording by irradiation with radiation during application of a predetermined bias voltage between the electrodes is detected as an electric signal, the method comprising the steps of:

heating a vapor-deposition cell holding therein selenium containing a predetermined amount of alkali metal;

passing the selenium containing the alkali metal through a mesh, the temperature of the mesh being controlled in the range of the melting point of selenium to 243° C.; and depositing the selenium containing the alkali metal by evaporation.

Further, another embodiment of a method for producing a photoconductive layer for recording of the present invention is a method for producing a photoconductive layer for recording of a radiation detector, wherein in the radiation detector, electrodes are provided on both sides of the photoconductive layer for recording and an electric charge generated within the photoconductive layer for recording by irradiation with radiation during application of a predetermined bias voltage between the electrodes is detected as an electric signal, the method comprising the steps of:

heating a vapor-deposition cell holding therein selenium that does not contain alkali metal, the vapor-deposition cell having been modified with a compound containing alkali metal;

passing the selenium containing the alkali metal through a mesh, the temperature of the mesh being controlled in the range of the melting point of selenium to 243° C.; and depositing the selenium containing the alkali metal by evaporation.

Further, in the method for producing a photoconductive layer for recording of a radiation detector, the alkali metal may optionally be sodium.

The radiation detector of the present invention is a radiation detector, wherein electrodes are provided on both sides of a photoconductive layer for recording, and wherein an electric charge generated within the photoconductive layer for recording by irradiation with radiation during application of a predetermined bias voltage between the electrodes is detected as an electric signal, and wherein the photoconductive layer for recording is made of amorphous selenium having a coordination number of 1.95±0.02. Therefore, it is possible to greatly improve the hole-transportability while maintaining high electron-transportability.

A method for producing a photoconductive layer for recording of the present invention includes the steps of:

heating a vapor-deposition cell holding therein selenium containing a predetermined amount of alkali metal;

passing the selenium containing the alkali metal through a mesh, the temperature of the mesh being controlled in the range of the melting point of selenium to 243° C.; and depositing the selenium containing the alkali metal by evaporation. Further, another method for producing a photoconductive layer for recording of the present invention includes the steps of:

heating a vapor-deposition cell holding therein selenium that does not contain alkali metal, the vapor-deposition cell having been modified with a compound containing alkali metal;

passing the selenium containing the alkali metal through a mesh, the temperature of the mesh being controlled in the range of the melting point of selenium to 243° C.; and depositing the selenium containing the alkali metal by evaporation. Therefore, it is possible to produce a photoconductive layer for recording made of amorphous selenium that has a coordination number of 1.95±0.02.

DESCRIPTION OF THE PREFERRED EMBODIMENTS

There are two kinds of radiation detectors, namely a direct-conversion-type radiation detector and an indirect-conversion-type radiation detector. The direct-conversion-type radiation detector converts radiation directly into charges and stores the charges. In contrast, in the indirect-conversion-type radiation detector, the radiation is first converted into light by a scintillator, such as CsI:Tl or $Gd_2O_2S$:Tb. Then, the light is converted into charges by an a-Si photodiode and the charges are stored. The radiation detector of the present invention may be utilized both as the direct-conversion-type radiation detector and as a light-electron conversion layer of the indirect-conversion-type radiation detector. Further, radiation, such as γ rays and α rays, other than X rays may be used as the radiation.

Further, the radiation detector of the present invention may be used both in a so-called light-readout method and in a so-called TFT method. In the light-readout method, readout is performed by a radiation image detector by utilizing a semiconductor material that generates charges by irradiation with light. In the TFT method, charges generated by irradiation with radiation are stored and the stored charges are read out by turning on/off an electrical switch, such as a thin film transistor (TFT), pixel by pixel (hereinafter, referred to as a TFT method).

Figure 1:
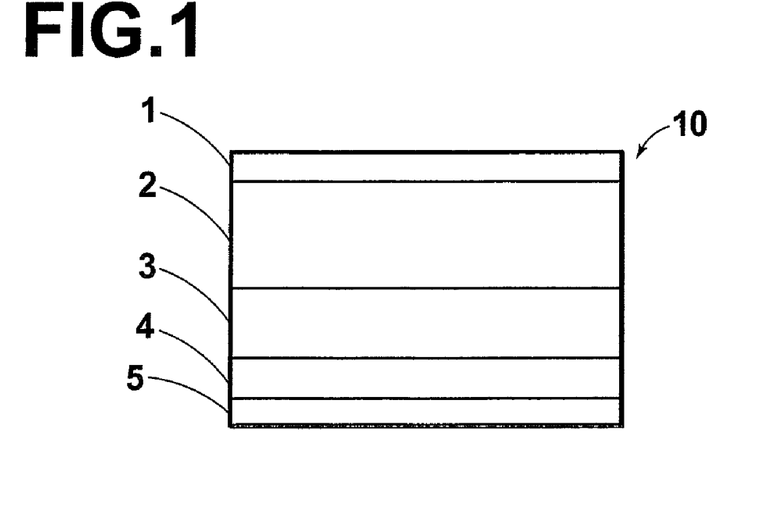
FIG. 1 is a diagram illustrating a cross section of a radiation detector according to an embodiment of the present invention.

First, a radiation detector used in the light-readout method will be described as an example. FIG. 1 is a diagram illustrating a cross-section of a radiation detector according to an embodiment of the present invention.

A radiation detector 10 includes a first conductive layer 1, a radiation conductive layer 2 for recording (radiation—for recording conductive layer 2), a charge transport layer (charge transfer layer) 3, a photoconductive layer for readout (readout-light conductive layer) 4 and a second conductive layer 5. Further, these layers are superposed one on another in this order. The first conductive layer 1 transmits radiation L1 for recording, which will be described later, therethrough. The radiation conductive layer 2 for recording exhibits conductivity by irradiation with the radiation L1 that has passed through the first conductive layer 1. The charge transport layer 3 substantially acts as an insulator with respect to charges (latent-image-polarity charges; for example, negative charges) charged in the first conductive layer 1. Further, the charge transport layer 3 substantially acts as a conductor with respect to charges (transport-polarity charges; in the aforementioned example, positive charges) that have a polarity opposite to that of the charges charged in the first conductive layer 1. The photoconductive layer 4 for readout exhibits conductivity by irradiation with readout light (electromagnetic wave) L2 for readout, which will be described later. Further, the second conductive layer 5 transmits the electromagnetic wave L2 therethrough.

As the conductive layers 1 and 5, layers, each formed by uniformly coating a transparent glass plate with a conductive material (a so-called nesa film or the like), may optionally be used. Specifically, a thin film (layer or coating) made of polycrystalline ITO ($In_2O_3$: Sn), amorphous ITO ($In_2O_3$: Sn), amorphous IZO ($In_2O_3$: Zn), ATO ($SnO_2$: Sb), FTO ($SnO_2$: F), AZO (ZnO: Al), GZO (ZnO: Ga), gold, silver, platinum, aluminum, indium or the like, a film (layer or coating) formed by applying a material in which a precious metal (noble metal) (platinum, gold or silver) having a size of approximately 10 to 1000 nm is dispersed or the like may be used.

In the charge transport layer 3, a difference between the mobility of negative charges charged in the conductive layer 1 and that of positive charges, the polarity of which is opposite to that of the negative charges, should be as large as possible. As the material for the charge transport layer 3, an organic compound, such as poly N-vinylcarbazole (PVK), N,N'-diphenyl-N,N'-bis (3-methylphenyl)-[1,1'-biphenyl]-4,4'-diamine (TPD), or a discotic crystal, a material in which a TPD polymer (polycarbonate, polystyrene, PVK and polyvinyl alcohol) is dispersed, $As_2Se_3$, $Sb_2S_3$, silicon oil, a semiconductor material, such as a-Se doped with Cl at 10 to 200 ppm, and polycarbonate are appropriate. Particularly, the organic compound (PVK, TPD, a discotic crystal and the like) is appropriate as the material because the organic compound is insensitive to light. Further, since the dielectric constant of the organic compound is generally low, if the organic compound is used, the capacity of the charge transport layer 3 and that of the photoconductive layer 4 for readout can be lowered. Therefore, it is possible to increase signal-extraction efficiency at the time of readout.

As the material for the photoconductive layer 4 for readout, a photoconductive material (substance) containing at least one of the following substances as a main component may be used. The substances are a-Se, a-Se doped with Cl at 10 to 200 ppm, Se—Te, Se—As—Te, $As_2Se_3$, non-metal phthalocyanine, metal phthalocyanine, MgPc (magnesium phthalocyanine), VoPc (phase II of Vanadyl phthalocyanine), CuPc (copper phthalocyanine), $Bi_{12}MO_{20}$ (M: Ti, Si or Ge), $Bi_4M_3O_{12}$ (M: Ti, Si or Ge), $Bi_2O_3$, $BiMO_4$ (M: Nb, Ta or V), $Bi_2WO_6$, $Bi_{24}B_2O_{39}$, ZnO, ZnS, ZnSe, ZnTe, $MNbO_3$ (M: Li, Na or K), PbO, $HgI_2$, $PbI_2$, CdS, CdSe, CdTe, $BiI_3$ and the like. Optionally, amorphous selenium that has a coordination number of 1.95±0.02 may be used.

The radiation conductive layer 2 for recording is made of amorphous selenium that has a coordination number of 1.95±0.02. It is desirable that the thickness of the radiation conductive layer 2 for recording is greater than or equal to 100 μm and less than or equal to 2000 μm. Optionally, when the radiation conductive layer 2 for recording is used for mammography, the thickness of the radiation conductive layer 2 for recording may be greater than or equal to 150 μm and less than or equal to 250 μm. When the radiation conductive layer 2 for recording is used for general radiography, the thickness of the radiation conductive layer 2 for recording may be greater than or equal to 500 μm and less than or equal to 1200 μm.

Further, an electron injection prevention layer may be provided between the first conductive layer and the radiation conductive layer 2 for recording. As the material for the electron injection prevention layer, antimony sulfide or N,N'-diphenyl-N,N'-bis(3-methylphenyl)-[1,1'-biphenyl]-4,4'-diamine (TPD) may be used. Further, a hole injection prevention layer may be provided between the photoconductive layer 4 for readout and the second conductive layer 5. As the material for the hole injection prevention layer, ceric oxide, antimony sulfide or zinc sulfide may be used.

Figure 2:
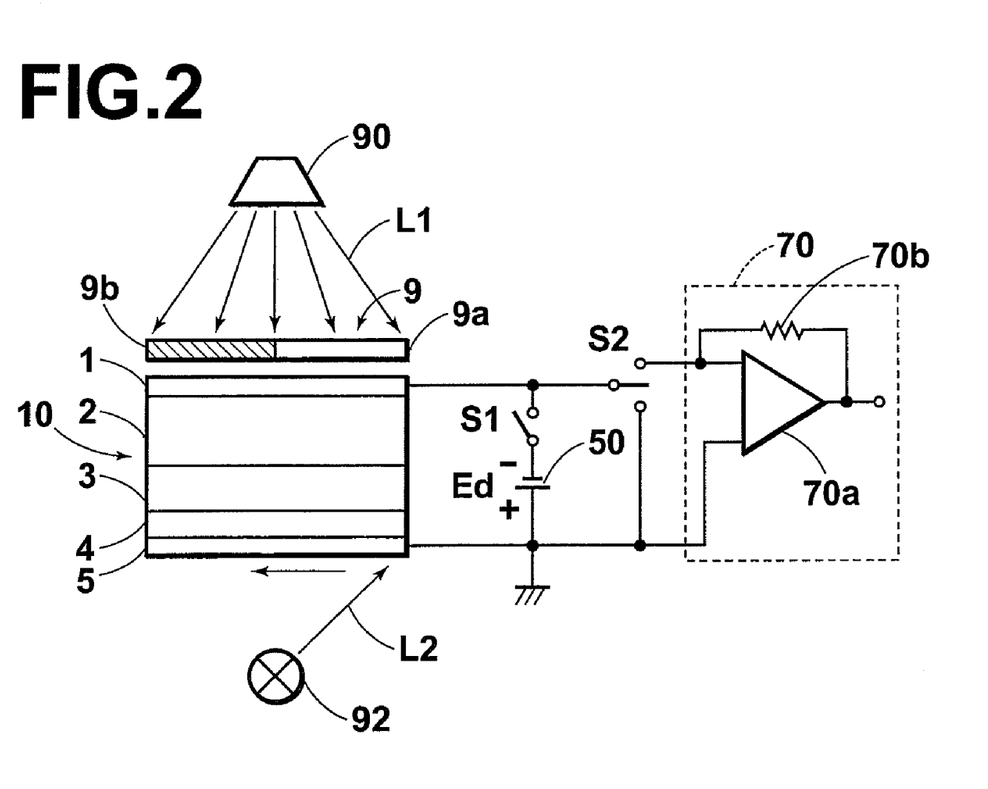
FIG. 2 is a schematic diagram illustrating the configuration of a recording/readout system using a radiation detector.
Figure 3A:
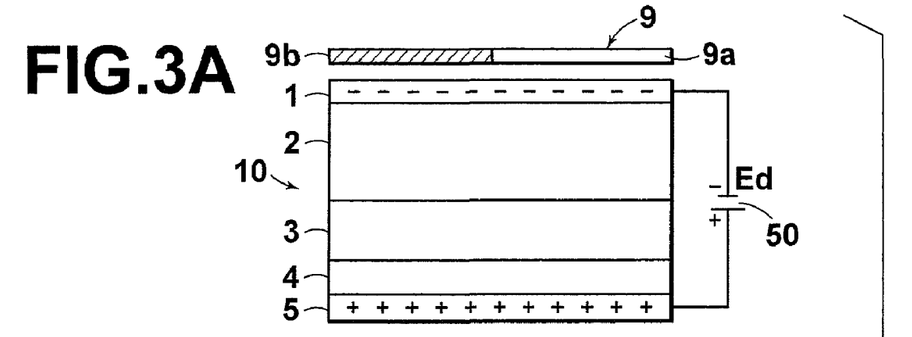
FIG. 3A is a diagram illustrating an electrostatic latent image recording process in the recording/readout system, the diagram using a charge model.
Figure 3B:
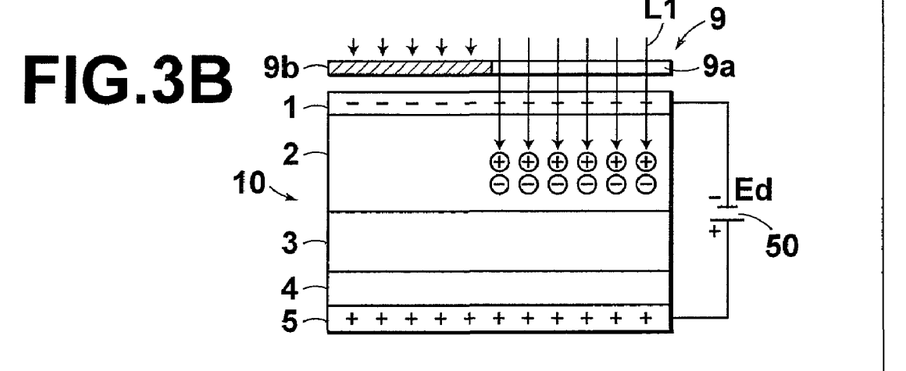
FIG. 3B is a diagram illustrating an electrostatic latent image recording process in the recording/readout system, the diagram using a charge model.
Figure 3C:
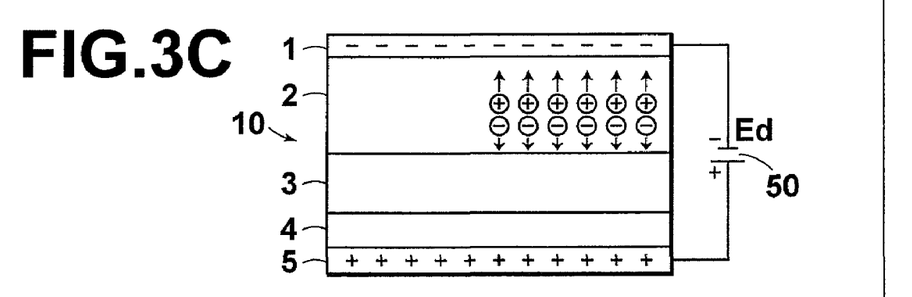
FIG. 3C is a diagram illustrating an electrostatic latent image recording process in the recording/readout system, the diagram using a charge model.
Figure 3D:
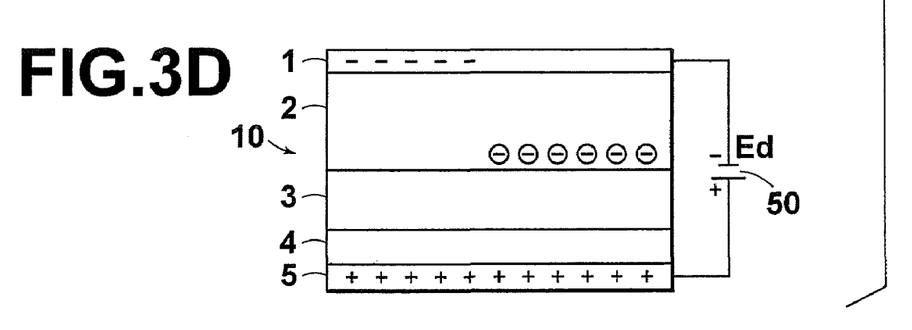
FIG. 3D is a diagram illustrating an electrostatic latent image recording process in the recording/readout system, the diagram using a charge model.

Next, a method using light for reading out electrostatic latent images will be briefly described. FIG. 2 is a schematic diagram illustrating the configuration of a recording/readout system (an electrostatic latent image recording apparatus and an electrostatic latent image readout apparatus are integrated with each other) using the radiation detector 10. The recording/readout system includes the radiation detector 10, an irradiation means 90 for recording, a power source 50, an electric current detection means 70, an exposure means 92 for readout and connection means S1 and S2. A portion of the system corresponding to the electrostatic latent image recording apparatus is formed by the radiation detector 10, the power source 50, the irradiation means 90 for recording and the connection means S1. Further, a portion corresponding to the electrostatic latent image readout apparatus is formed by the radiation detector 10, the electric current detection means 70 and the connection means S2.

The conductive layer 1 of the radiation detector 10 is connected to the negative pole of the power source 50 through the connection means S1. Further, the conductive layer 1 is connected to an end of the connection means S2. One of the other ends of the connection means S2 is connected to the electric current detection means 70. Further, the conductive layer 5 of the radiation detector 10, the positive pole of the power source 50 and the other one of the other ends of the connection means S2 are grounded. The electric current detection means 70 includes a detection amplifier 70a, formed by an operational amplifier, and a feedback resistance 70b. The electric current detection means 70 forms a so-called electric-current/voltage conversion circuit.

The conductive layer 5 may have a structure disclosed in Japanese Unexamined Patent Publication No. 2001-337171 or Japanese Unexamined Patent Publication No. 2001-160922.

A subject 9 is placed on the upper surface of the conductive layer 1. The subject 9 includes a portion 9a that transmits radiation L1 therethrough and a blocking portion (shield) 9b, which does not transmit the radiation L1 therethrough. The irradiation means 90 for recording irradiates the subject 9 so that the subject 9 is uniformly (evenly) exposed to the radiation L1. The exposure means 92 for readout performs scan-exposure with readout light L2, such as laser light, LED, organic EL and inorganic EL, in the direction of the arrow in FIG. 2. It is desirable that the readout light L2 has a linearly converged shape (a cross-section in straight-line form).

Next, a process for recording an electrostatic latent image in the recording/readout system that is structured as described above will be described with reference to a charge model (FIGS. 3A through 3D). In FIG. 2, the connection means S2 is set to an open state (connected neither to the ground nor to the electric current detection means 70). The connection means S1 is turned on and direct-current voltage Ed is applied between the conductive layer 1 and the conductive layer 5 by the power source 50. Then, negative charges from the power source 50 are charged in the conductive layer 1, and positive charges from the power source 50 are charged in the conductive layer 5 (please refer to FIG. 3A). Accordingly, electric fields parallel to each other are formed between the conductive layers 1 and 5 in the radiation detector 10.

Then, the irradiation means 90 for recording irradiates the subject 9 with radiation L1 so that the subject 9 is uniformly exposed to the radiation L1. The radiation L1 passes through the portion 9a of the subject 9, the portion transmitting radiation, and further passes through the conductive layer 1. The radiation conductive layer 2 receives the radiation L1 that has passed through the conductive layer 1 and exhibits conductivity. This process may be understood as a process in which the radiation conductive layer 2 functions as a variable resistor, which indicates a variable resistance value based on the dose of the radiation L1. The resistance value depends on (or is determined by) generation of a charge pair, a pair of an electron (a negative charge) and a hole (a positive charge), by irradiation with the radiation L1. If the dose of the radiation L1 that has passed through the subject 9 is smaller, the resistance value is larger (please refer to FIG. 3B). In the diagrams, negative charges (−) and positive charges (+) generated by irradiation with the radiation L1 are indicated with "−" and "+" in circles.

The positive charges generated in the radiation conductive layer 2 move at high speed in the radiation conductive layer 2 toward the conductive layer 1. Then, the positive charges recombine with the negative charges that are charged in the conductive layer 1 at the interface between the conductive layer 1 and the radiation conductive layer 2 and disappear (please refer to FIGS. 3C and 3D). Meanwhile, the negative charges generated in the radiation conductive layer 2 move in the radiation conductive layer 2 toward the charge transport layer 3. The charge transport layer 3 functions as an insulator with respect to charges (negative charges in this example) that have the same polarity as that of the charges charged in the conductive layer 1. Therefore, the negative charges that have moved through the radiation conductive layer 2 stop at the interface between the radiation conductive layer 2 and the charge transport layer 3, and stored (accumulated) at the interface (please refer to FIGS. 3C and 3D). In the radiation detector of the present invention, the photoconductive layer for recording is made of amorphous selenium that has a coordination number of 1.95±0.02. Therefore, it is possible to greatly improve the transportability of the holes while the high transportability of the electrons is maintained. Further, the amount of charges that will be stored is determined by the amount of negative charges generated in the radiation conductive layer 2. In other words, the amount is determined by the dose of radiation L1 that has passed through the subject 9.

Meanwhile, the radiation L1 does not pass through the blocking portion 9b of the subject 9. Therefore, a portion of the radiation detector 10 under the blocking portion 9b does not change at all (please refer to FIGS. 3B through 3D). As described above, charges corresponding to an image of the subject can be stored at the interface between the radiation conductive layer 2 and the charge transport layer 3 by exposing the subject 9 to radiation L1. The image of the subject formed by the stored charges is referred to as an electrostatic latent image.

Figure 4A:
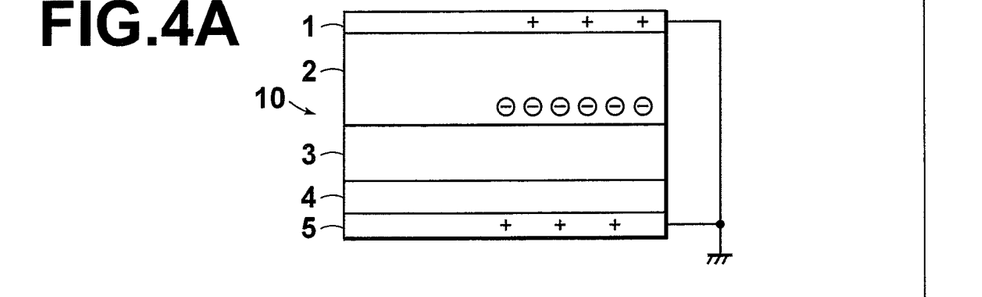
FIG. 4A is a diagram illustrating an electrostatic latent image readout process in the recording/readout system, the diagram using a charge model.
Figure 4B:
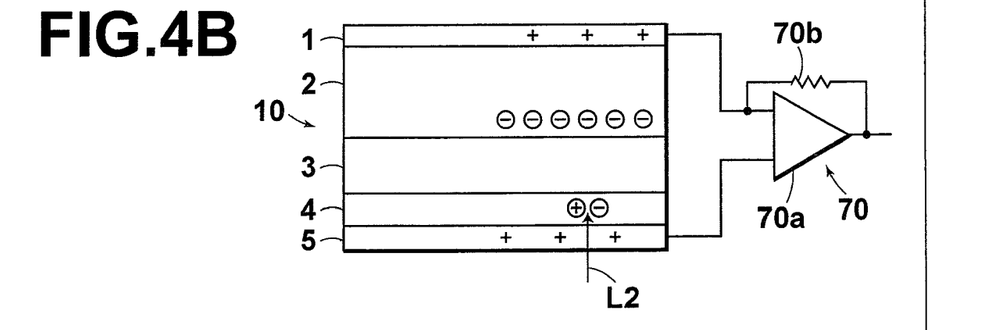
FIG. 4B is a diagram illustrating an electrostatic latent image readout process in the recording/readout system, the diagram using a charge model.
Figure 4C:
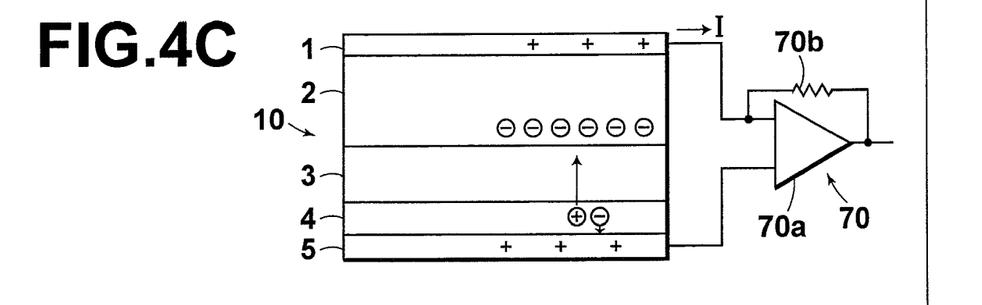
FIG. 4C is a diagram illustrating an electrostatic latent image readout process in the recording/readout system, the diagram using a charge model.

Next, an electrostatic latent image readout process will be described with reference to a charge model (FIGS. 4A through 4C). The connection means S1 is set to an open state, and power supply is stopped. Further, the connection means S2 is connected to the ground side once. Then, the conductive layer 1 and the conductive layer 5 of the radiation detector 10, in which an electrostatic latent image has been recorded, are charged at the same electric potential and the charges are rearranged (please refer to FIG. 4A). After then, the connection means S2 is connected to the electric current detection means 70 side.

When the exposure means 92 for readout performs scan-exposure on the radiation detector 10 with the readout light L2 from the conductive layer 5 side thereof, the readout light L2 passes through the conductive layer 5, and the photoconductive layer 4 is irradiated with the readout light L2 that has passed through the conductive layer 5. Accordingly, the photoconductive layer 4 exhibits conductivity based on the scan-exposure. This process depends on (or is determined by) generation of a pair of charges (a positive charge and a negative charge) by irradiation with the readout light L2 (please refer to FIG. 4B) in a manner similar to the process in which the radiation conductive layer 2 exhibits conductivity by generation of a pair of charges (a positive charge and a negative charge) by irradiation with the radiation L1. In FIGS. 4A through 4C, negative charges (−) and positive charges (+) generated by irradiation with the readout light L2 are indicated with "−" and "+" in circles in a manner similar to the illustration of the recording process.

Figure 4D:
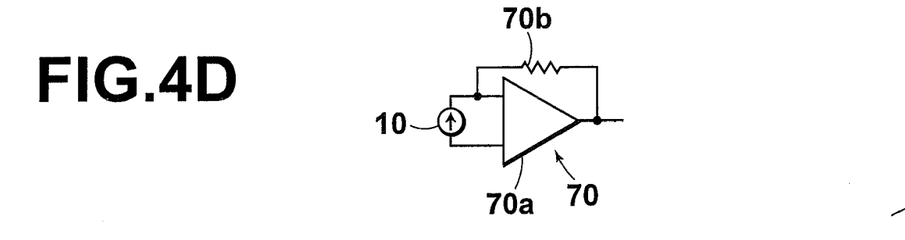
FIG. 4D is a diagram illustrating an electrostatic latent image readout process in the recording/readout system, the diagram using a charge model.

The charge transport layer 3 acts as a conductor with respect to positive charges. Therefore, the positive charges generated in the photoconductive layer 4 rapidly move in the charge transport layer 3 in such a manner that the positive charges are attracted by stored charges (accumulated charges). The positive charges recombine with the stored charges at the interface between the radiation conductive layer 2 and the charge transport layer 3 and disappear (please refer to FIG. 4C). Meanwhile, the negative charges generated in the photoconductive layer 4 recombine with the positive charges of the conductive layer 5 and disappear (please refer to FIG. 4C). The scan-exposure has been performed on the photoconductive layer 4 with the readout light L2 that has a sufficient light amount. Therefore, all of the stored charges accumulated at the interface between the radiation conductive layer 2 and the charge transport layer 3 (in other words, the whole electrostatic latent image) disappear by recombination of the charges. In the radiation detector of the present invention, the photoconductive layer for recording is made of amorphous selenium that has a coordination number of 1.95±0.02. Therefore, it is possible to greatly improve the transportability of the holes while maintaining the high transportability of the electrons. The aforementioned process, in which charges stored in the radiation detector 10 disappear, represents a flow of electric current I in the radiation detector 10 by movement of the charges. Therefore, this state can be represented by an equivalent circuit illustrated in FIG. 4D. In FIG. 4D, the radiation detector 10 is illustrated as an electric current source, in which the amount of electric current depends on the amount of stored charges.

As described above, while scan-exposure with the readout light L2 is being performed, electric current flowing out of the radiation detector 10 is detected. Accordingly, it is possible to sequentially read out the amount of charges stored in each portion (corresponding to each pixel) on which scan-exposure has been performed. Consequently, it is possible to read out an electrostatic latent image. The operation of such a radiation detector is described in Japanese Unexamined Patent Publication No. 2000-105297 and the like.

Figure 5:
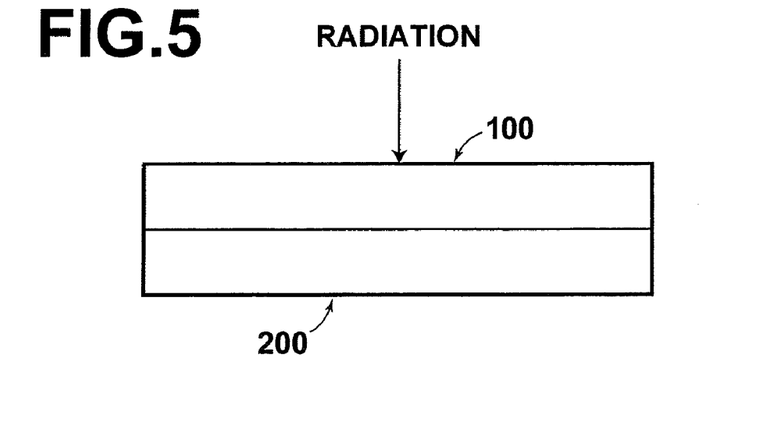
FIG. 5 is a schematic diagram illustrating a state in which a radiation detector and an AMA substrate are combined together.
Figure 6:
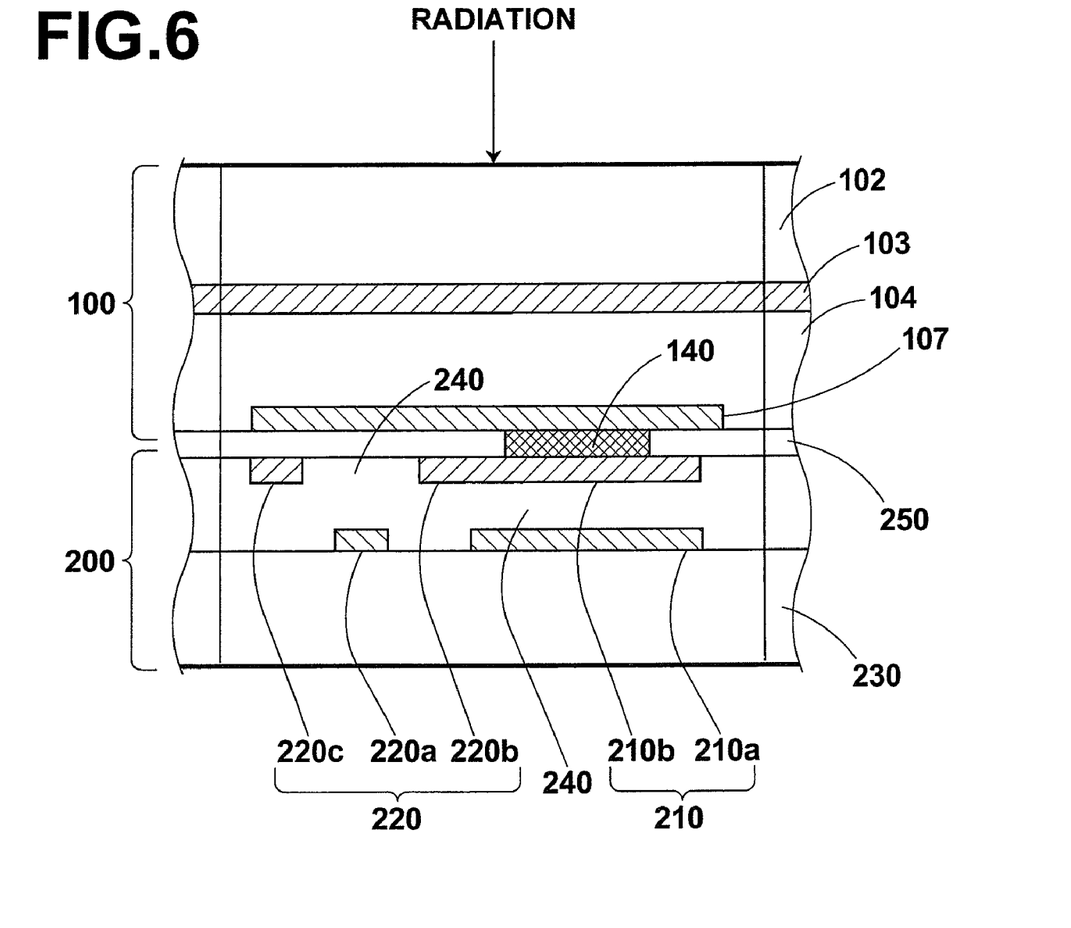
FIG. 6 is a schematic diagram illustrating a cross section of a pixel portion of a radiation detector.

Next, the TFT-type radiation detector, the latter example, will be described. As illustrated in FIG. 5, the TFT-type radiation detector is formed by attaching a radiation detection unit 100 and an active matrix array substrate (hereinafter, referred to as an AMA substrate) 200 to each other. As illustrated in FIG. 6, the radiation detection unit 100 mainly includes a common electrode 103 for applying bias voltage, a photoconductive layer 104 and a detection electrode 107 for collecting carriers. The common electrode 103, the photoconductive layer 104 and the detection electrode 107 are superposed one on another in this order from the radiation-incident side. The photoconductive layer 104 responds to radiation, which is a detection object, and generates carriers, which are electron-hole pairs. The radiation detection unit 100 may further include a radiation-detection-unit support member on the upper surface of the common electrode 103.

The photoconductive layer 104 is made of amorphous selenium that has a coordination number of 1.95±0.02. Further, the common electrode 103 and the detection electrode 107 are made of a conductive material, such as ITO (indium tin oxide), Au or Pt. Further, a hole injection prevention layer and an electron injection prevention layer may be additionally provided for the common electrode 103 and the detection electrode 107 based on the polarity of the bias voltage. As the material for the hole injection prevention layer, ceric oxide, antimony sulfide or zinc sulfide may be used. As the material for the electron injection prevention layer, antimony sulfide or N,N'-diphenyl-N,N'-bis(3-methylphenyl)-[1,1'-biphenyl]-4,4'-diamine (TPD) may be used.

Figure 7:
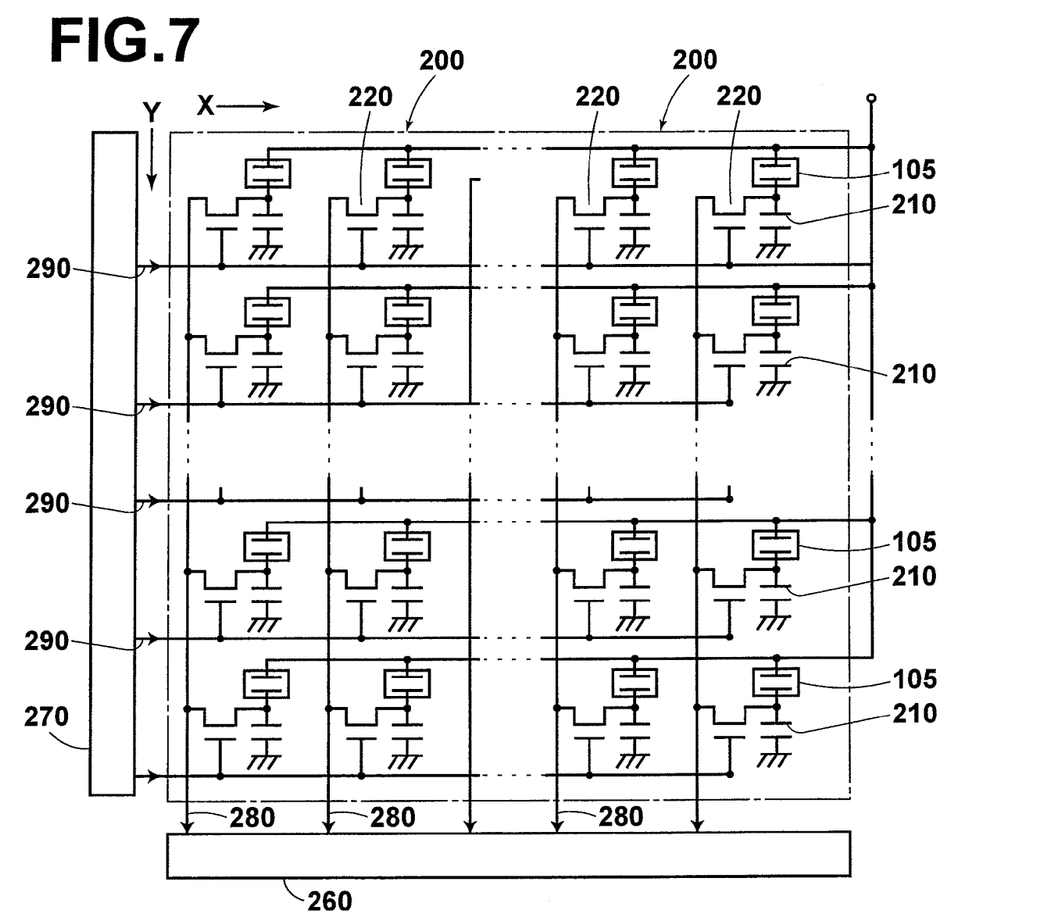
FIG. 7 is an electric circuit diagram illustrating equivalent circuits of an AMA substrate.

The structure of each element of the AMA substrate 200 will be briefly described. As illustrated in FIG. 7, in the AMA substrate 200, a capacitor (condenser) 210 and a TFT 220 are provided for each radiation detection unit 105, which corresponds to a pixel portion. The capacitor 210 stores charges, and the TFT 220 functions as a switching device. In a support member 102, radiation detection units 105 corresponding to pixels are two-dimensionally arranged. The radiation detection units 105 are arranged in matrix form of approximately 1000 to 3000 (in the vertical direction) by 1000 to 3000 (in the horizontal direction) based on the number of required pixels. Further, in the AMA substrate 200, capacitors 210 and TFT's 220 are two-dimensionally arranged in matrix form in a manner similar to the arrangement of the radiation detection units 105. The number of the capacitors 210 and that of the TFT's 220 are the same as the number of the pixels. When charges are generated in the photoconductive layer, the charges are stored in the capacitor 210 and an electrostatic latent image appropriate for the light-readout method is formed. In the TFT method, the electrostatic latent image generated by irradiation with radiation is kept at charge storage capacity.

FIG. 6 illustrates an actual structure of the capacitor 210 and the TFT 220 in the AMA substrate 200. Specifically, an AMA substrate support member 230 is an insulator, and a ground-side electrode 210a of the capacitor 210 and a gate electrode 220a of the TFT 200 are formed on the surface of the AMA substrate support member 230. Further, a connection-side electrode 210b of the capacitor 210, a source electrode 220b of the TFT 220 and a drain electrode 220c of the TFT 220 are superposed on the ground-side electrode 210a and the gate electrode 220a through an insulation layer (insulation film) 240. Further, the uppermost surface-side of the AMA substrate 200 is coated with an insulation layer (film) 250 for protection. Further, the connection-side electrode 210b and the source electrode 220b are connected to each other. The two electrodes have been formed at the same time. As the insulation layer 240, which forms both of a capacity insulation film of the capacitor 210 and a gate insulation film of the TFT 220, a plasma SiN film is used, for example. The AMA substrate 200 is produced by using a thin-film formation technique or a very fine processing technique, which are used in production of a substrate for a liquid crystal display.

Next, the process for attaching the radiation detection unit 100 and the AMA substrate 200 to each other will be described. The detection electrode 107 and the connection-side electrode 210b of the capacitor 210 are positioned (the positions of the detection electrode 107 and the connection-side electrode 210b are adjusted). Then, in this state, the radiation detection unit 100 and the AMA substrate 200 are attached to each other by heating or by applying pressure in such a manner that an anisotropically conductive film (ACF) is inserted therebetween. The anisotropically conductive film contains conductive particles, such as silver particles, and has conductivity only in the thickness direction of the film. Accordingly, the radiation detection unit 100 and the AMA substrate 200 are mechanically joined together, and the detection electrode 107 and the connection-side electrode 210b are electrically connected to each other through an intervening conductive portion 140.

Further, a readout drive circuit 260 and a gate drive circuit 270 are provided for the AMA substrate 200. As illustrated in FIG. 7, the readout drive circuit 260 is connected to readout wirings (readout address lines) 280. The readout wiring 280 is a readout line in the vertical direction (Y-direction), and the readout wiring 280 connects drain electrodes of the TFT's 220 in the same column. The gate drive circuit 270 is connected to readout wirings (readout address lines) 290. The readout wiring 290 is a readout line in the horizontal direction (X-direction), and the readout wiring 290 connects gate electrodes of the TFT's 220 in the same row. Further, although not illustrated, in the readout drive circuit 260, a preamplifier (charge-voltage converter) is connected to each of the readout wirings 280. The readout drive circuit 260 and the gate drive circuit 270 are connected to the AMA substrate 200, as described above. The readout drive circuit 260 and the gate drive circuit 270 may be monolithically formed in the AMA substrate 200 and integrated.

An operation for detecting radiation by the aforementioned radiography apparatus, in which the radiation detection unit 100 and the AMA substrate 200 are attached to each other, is described, for example, in Japanese Unexamined Patent Publication No. 11 (1999)-287862.

Figure 8:
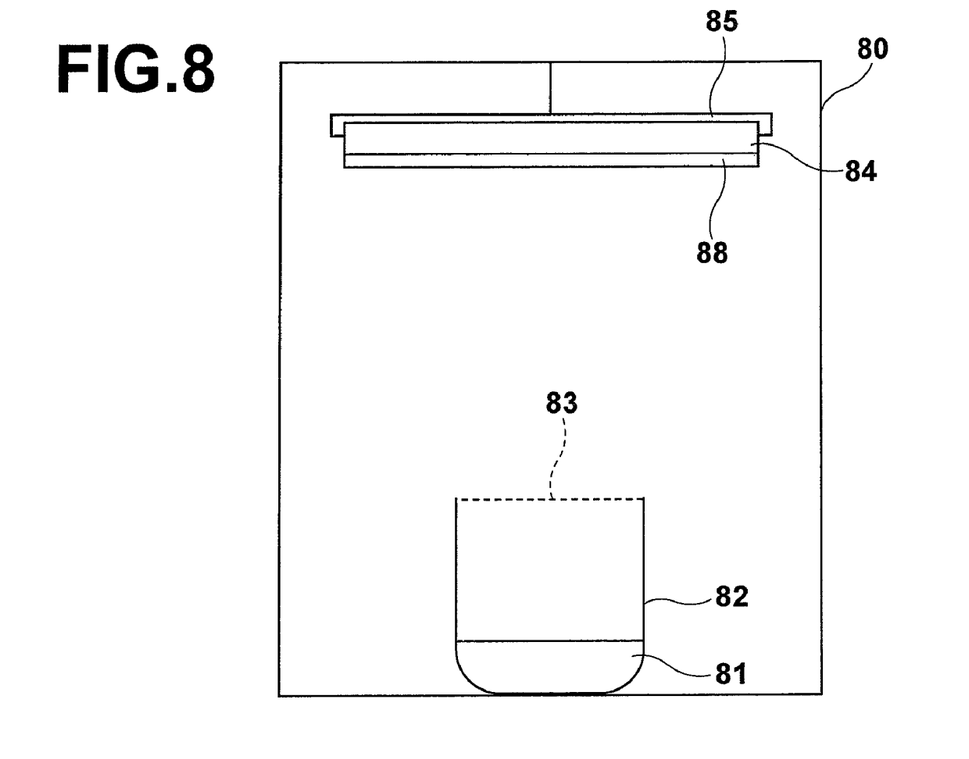
FIG. 8 is a schematic diagram illustrating a cross section of a vacuum vapor-deposition apparatus for producing a photoconductive layer for recording of the present invention.
Figure 9:
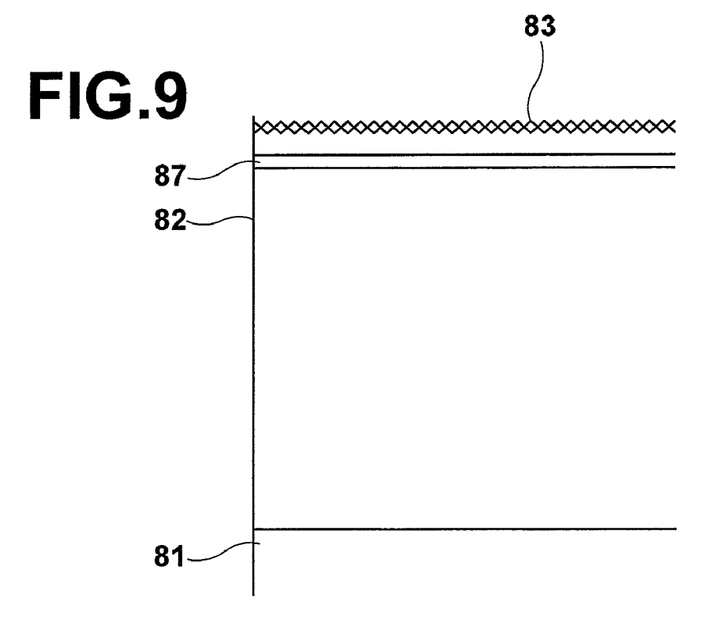
FIG. 9 is a partially enlarged diagram illustrating a cross section of a vapor-deposition cell illustrated in FIG. 8.

FIG. 8 is a schematic diagram illustrating a cross section of a vacuum vapor-deposition apparatus for producing a photoconductive layer for recording of the present invention. FIG. 9 is a partially-enlarged diagram illustrating a cross section of a vapor-deposition cell (vessel or container). A vapor-deposition apparatus 80 includes a vapor-deposition cell 82, a mesh filter 83 and a holding member 85. The vapor-deposition cell 82 stores selenium 81 containing alkali metal, which is an evaporation source. The mesh filter 83 is provided at an upper part of the vapor-deposition cell 82. The holding member 85 holds a substrate 84, on which the evaporation source will be deposited. Further, a heater 87 is provided under the mesh filter 83 to control the temperature of the mesh filter 83.

As the mesh filter, a metal mesh (metal net) made of stainless steel, tantalum, molybdenum, tungsten or the like, a ceramic mesh (ceramic net) or the like may be used. It is desirable that the mesh count per inch of the mesh is in the range of #100 to #625. Further, the temperature of the mesh may be controlled by causing an electric current to run through the mesh. Alternatively, the temperature of the mesh may be controlled by using a heater, such as a sheath heater, or by using an oil-cooling pipe or the like. In the sheath heater, a heating element (such as a Nichrome wire) is held in a metal sheath (sheath) and the space between the metal sheath and the heating element is filled with powder of an insulator (such as magnesium oxide) that has high thermal conductivity.

The method for performing vapor-deposition is not particularly limited to so-called rotation vapor-deposition, straight-line-conveyance vapor-deposition and the like. Selenium 81, as a raw material, may be heated in the vapor-deposition cell 82 by a heating source (not illustrated) connected to the vapor-deposition cell 82 to create a vapor flow of the selenium. Then, the vapor flow passes through the mesh filter 83, the temperature of which is controlled by the heater 87, and the selenium is deposited on the substrate 84. Accordingly, vapor-deposition selenium layer 88 is formed.

In the above description, a case in which selenium containing alkali metal is used as the raw material, which is an evaporation source, has been described. However, the vapor-deposition selenium layer 88 may be formed in a similar manner by using, as the raw material which is the evaporation source, selenium that does not contain alkali metal, and by using a vapor-deposition cell 82 that has been modified with a compound containing alkali metal.

Next, examples of the production method according to the present invention will be described.

EXAMPLES

Samples 1 through 4

Selenium containing sodium at approximately 10 ppm was heated in a vapor-deposition cell to which a metal mesh (#300 (mesh count per inch of the mesh is 300)) made of stainless steel was attached. The temperature of the mesh was controlled in the range of the melting point (220) of selenium to 250° C., as shown in Table 1, and selenium was deposited at 100 to 200 μm by evaporation. The temperature of the mesh was measured at the frame of the mesh.

Sample 5

Selenium containing sodium at approximately 10 ppm was heated at a vapor-deposition source temperature of 255° C., and selenium was deposited at 100 to 200 μm by evaporation.

The selenium layer (film or coating) of each of samples 1 through 5 was measured to obtain a coordination number, distribution of the densities of states of holes at a localized level (DOS [$\times 10^{13}$ eV$^{-1}$·cm$^{-3}$]) and value μτ of holes (hole range (distance) per unit electric field$\times 10^{-6}$ cm$^2$/V) of the layer.

The coordination number was measured by using XAFS (X-Ray Absorption Fine Structure) method (transmission method). Each of the selenium layers was ground into powder and cooled down to 20K by a cryocooler. Then, XAFS measurement was performed at BL-9A of Photon Factory of the Institute of Materials Structure Science (High Energy Accelerator Research Organization). The XAFS of trigonal Se (selenium) was used as a standard, and curve fitting was performed from wave number k=3–12 Å$^{-1}$ to k=3–16 Å$^{-1}$. In this example, a value at wave number k=3–15 Å$^{-1}$ was used.

Further, the distribution of the densities of states of holes at a localized level was obtained based on the descriptions in T. Nagase, H. Naito, T. IEE Japan, 118-A, 1446 (1998). The distribution of the densities of states of holes at a localized level was obtained by analyzing the numerical value of TOF measurement data using Laplace transformation.

Further, value μτ of holes was obtained based on the descriptions in S. O. Kasap, J. A. Rowlands, Journal of Materials: Materials in Electronics, 11, 179 (2000). The mobility μ(cm$^2$/Vs) and the life τ(s) of holes were obtained by using a TOF measurement method (Time-of-Flight measurement method), and the product of the mobility μ(cm$^2$/Vs) times the life τ (s) was obtained.

Figure 10:
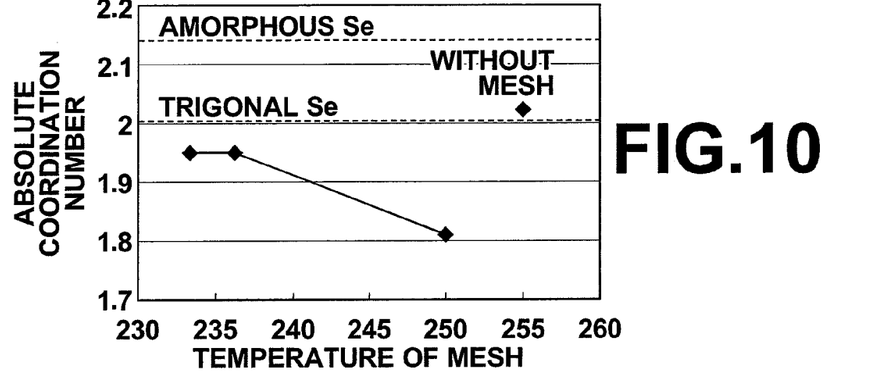
FIG. 10 is a graph showing relationships between the temperatures of a mesh and absolute coordination numbers.
Figure 11:
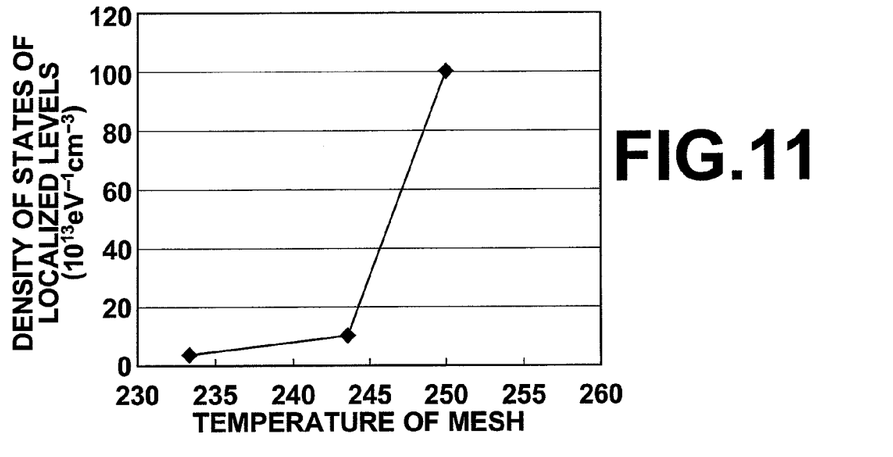
FIG. 11 is a graph showing relationships between the temperatures of a mesh and distribution of the densities of states of holes at a localized level.
Figure 12:
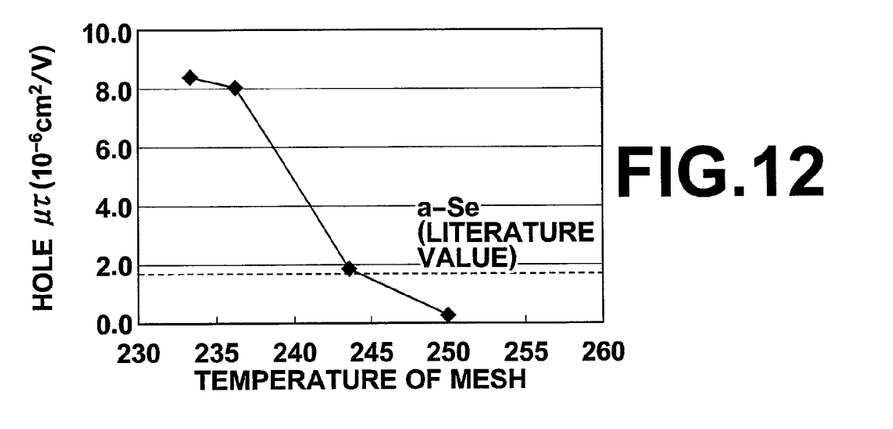
FIG. 12 is a graph showing relationships between the temperatures of a mesh and values μτ of holes.

The results are shown in Table 1. Further, relationships between the temperatures of the mesh and the absolute coordination numbers are illustrated in FIG. 10. Further, relationships between the temperatures of the mesh and the densities of states of holes at a localized level are illustrated in FIG. 11, and relationships between the temperatures of the mesh and values μτ of holes are illustrated in FIG. 12. In Table 1 and the diagrams, all of the coordination number of the amorphous selenium, that of the trigonal selenium and the value μτ of holes of the amorphous selenium are values obtained from literature (literature values). In Table 1, blanks represent that no measurement has been performed. The literature values have been quoted from A. V. Kolovov, H. Oyanagi, K. Tanaka and K. Tanaka, Phys. Rev. B55, 726 (1997) and S. O. Kasap, K. V. Koughia, B. Fogal, G. Belev and R. E. Johanson.

Semiconductors, Vol. 37, No. 7, 2003 pp. 789-794, From Fizika i Tekhnika Poluprovodnikov, Vol. 37, No. 7, 2003, pp. 816-821.

TABLE 1

| | Temperature of Mesh (° C.) | Coordination Number | Hole Trap Amount ($\times 10^{13}$ eV$^{-1}$·cm$^{-3}$) | Value μτ of Hole ($\times 10^{-6}$ cm$^2$/V) |
|---|---|---|---|---|
| a-Se | — | 2.15 | — | 1.5 |
| Trigonal Se | — | 2 | — | — |
| Sample 1 | 236 | 1.95 | | 8.0 |
| Sample 2 | 233 | 1.95 | 5 | 8.4 |
| Sample 3 | 243 | | 10 | 1.8 |
| Sample 4 | 250 | 1.81 | 100 | 0.3 |
| Sample 5 | 255 | 2.03 | | Less than or equal to 0.01 |

As shown in Table 1 and illustrated in FIG. 10, the coordination number increases in proportion to the decrease in the temperature of the mesh. In sample 5, in which no mesh was used, the coordination number was 2.03. Further, distribution of the densities of states of holes at a localized level was obtained with respect to a selenium film. Then, as shown in Table 1 and illustrated in FIG. 11, it was confirmed that the density of states of holes at a localized level in the vicinity of 0.4 eV decreases to approximately 1/20 in proportion to the decrease in the temperature of the mesh. Further, as shown in Table 1 and FIG. 12, the value μτ of holes increases from 0.3($\times 10^{-6}$ cm$^2$/V) to 8.0 ($\times 10^{-6}$ cm$^2$/V) in proportion to the decrease in the temperature of the mesh. In sample 5, in which no mesh was used, the value μτ of holes was less than or equal to 0.01 ($\times 10^{-6}$ cm$^2$/V).

As this result shows, if the photoconductive layer for recording is formed by amorphous selenium that has a coordination number of 1.95±0.02, it is possible to reduce the density of states of holes at a localized level in the vicinity of 0.4 eV to approximately 1/20. Further, it is possible to increase the value μτ of holes to greater than or equal to 2.0 ($\times 10^{-6}$ cm$^2$/V). Hence, it is possible to greatly improve the transportability of holes while maintaining the transportability of electrons at a high level.

What is claimed is:

1. A radiation detector, wherein electrodes are provided on both sides of a photoconductive layer for recording, and wherein an electric charge generated within the photoconductive layer for recording by irradiation with radiation during application of a predetermined bias voltage between the electrodes is detected as an electric signal, and wherein the photoconductive layer for recording is made of amorphous selenium having a coordination number of 1.95±0.02.

2. A radiation detector, as defined in claim 1, comprising:
a first conductive layer that transmits radiation for recording;
the photoconductive layer for recording, which exhibits photoconductivity by irradiation with the radiation for recording;
a photoconductive layer for readout that exhibits photoconductivity by irradiation with an electromagnetic wave for readout; and
a second conductive layer that transmits the electromagnetic wave for readout, wherein these layers are superposed one on another in this order, and wherein radiation image information is recorded as an electrostatic latent image, and wherein the photoconductive layer for readout is made of amorphous selenium having a coordination number of 1.95±0.02.

3. A method for producing a photoconductive layer for recording of a radiation detector, wherein in the radiation detector, electrodes are provided on both sides of the photoconductive layer for recording and an electric charge generated within the photoconductive layer for recording by irradiation with radiation during application of a predetermined bias voltage between the electrodes is detected as an electric signal, the method comprising the steps of:
heating a vapor-deposition cell holding therein selenium containing a predetermined amount of alkali metal;
passing the selenium containing the alkali metal through a mesh, the temperature of the mesh being controlled in the range of the melting point of selenium to 243° C.; and
depositing the selenium containing the alkali metal by evaporation.

4. A method for producing a photoconductive layer for recording of a radiation detector, wherein in the radiation detector, electrodes are provided on both sides of the photoconductive layer for recording and an electric charge generated within the photoconductive layer for recording by irradiation with radiation during application of a predetermined bias voltage between the electrodes is detected as an electric signal, the method comprising the steps of:
heating a vapor-deposition cell holding therein selenium that does not contain alkali metal, the vapor-deposition cell having been modified with a compound containing alkali metal;
passing the selenium containing the alkali metal through a mesh, the temperature of the mesh being controlled in the range of the melting point of selenium to 243° C.; and
depositing the selenium containing the alkali metal by evaporation.

5. A method for producing a photoconductive layer for recording of a radiation detector, as defined in claim 3, wherein the alkali metal is sodium.

6. A method for producing a photoconductive layer for recording of a radiation detector, as defined in claim 4, wherein the alkali metal is sodium.

* * * * *